United States Patent
Kanda et al.

(10) Patent No.: US 11,876,120 B2
(45) Date of Patent: Jan. 16, 2024

(54) SEMICONDUCTOR DEVICE AND METHOD OF MANUFACTURING SEMICONDUCTOR DEVICE

(71) Applicant: Nuvoton Technology Corporation Japan, Kyoto (JP)

(72) Inventors: Yusuke Kanda, Toyama (JP); Kenichi Miyajima, Toyama (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 0 days.

(21) Appl. No.: 17/765,765

(22) PCT Filed: May 24, 2021

(86) PCT No.: PCT/JP2021/019635
§ 371 (c)(1),
(2) Date: Mar. 31, 2022

(87) PCT Pub. No.: WO2021/246227
PCT Pub. Date: Dec. 9, 2021

(65) Prior Publication Data
US 2022/0262917 A1    Aug. 18, 2022

(30) Foreign Application Priority Data
Jun. 1, 2020  (JP) ................. 2020-095432

(51) Int. Cl.
*H01L 29/778* (2006.01)
*H01L 29/45* (2006.01)
(Continued)

(52) U.S. Cl.
CPC ........ *H01L 29/452* (2013.01); *H01L 29/2003* (2013.01); *H01L 29/778* (2013.01);
(Continued)

(58) Field of Classification Search
None
See application file for complete search history.

(56) References Cited

U.S. PATENT DOCUMENTS

2007/0051978 A1    3/2007  Mita et al.
2007/0057290 A1*   3/2007  Ishida ................. H01L 29/2003
                                                257/E29.253
(Continued)

FOREIGN PATENT DOCUMENTS

JP    2006-120694 A    5/2006
JP    2007-053185 A    3/2007
(Continued)

OTHER PUBLICATIONS

Hoshino, T. "Electron mobility calculation for two-dimensional electron gas in InN/GaN digital alloy channel high electron mobility transistors" Jap. Jour. of App. Phys. 58 May 14, 2019 pp. SCCD10-1 through SCCD101-6 (Year: 2019).*

(Continued)

*Primary Examiner* — Grant S Withers
(74) *Attorney, Agent, or Firm* — Rimon, P.C.

(57) ABSTRACT

A semiconductor device includes: a channel layer not containing Al; a barrier layer above the channel layer containing Al; a recess; and an ohmic electrode in the recess, which is in ohmic contact with a two-dimensional electron gas layer. An Al composition ratio distribution of the barrier layer has a maximum point at a first position. The semiconductor device includes: a first inclined surface of the barrier layer which includes the first position and is in contact with the ohmic electrode; and a second inclined surface of the barrier layer which intersects the first inclined surface on a lower side of the first inclined surface, and is in contact with the ohmic electrode. To the surface of the substrate, an angle of the second inclined surface is smaller than an angle of the (Continued)

first inclined surface. A position of the first intersection line is lower than the first position.

33 Claims, 13 Drawing Sheets

(51) Int. Cl.
    *H01L 29/20*     (2006.01)
    *H01L 29/78*     (2006.01)
    *H01L 29/808*    (2006.01)
    *H01L 29/812*    (2006.01)

(52) U.S. Cl.
    CPC ...... *H01L 29/7786* (2013.01); *H01L 29/7787* (2013.01); *H01L 29/78* (2013.01); *H01L 29/808* (2013.01); *H01L 29/812* (2013.01)

(56) References Cited

U.S. PATENT DOCUMENTS

| | | |
|---|---|---|
| 2011/0095337 A1 | 4/2011 | Sato |
| 2011/0204379 A1 | 8/2011 | Sato |
| 2012/0248500 A1 | 10/2012 | Kajitani |
| 2013/0193486 A1 | 8/2013 | Kinoshita et al. |
| 2015/0194483 A1 | 7/2015 | Kajitani et al. |
| 2015/0349108 A1 | 12/2015 | Fujita |
| 2019/0326404 A1 | 10/2019 | Kumazaki et al. |

FOREIGN PATENT DOCUMENTS

| | | |
|---|---|---|
| JP | 2011-091200 A | 5/2011 |
| JP | 2011-129769 A | 6/2011 |
| JP | 2011-171640 A | 9/2011 |
| JP | 2012-099542 A | 5/2012 |
| WO | 2014/050054 A1 | 4/2014 |

OTHER PUBLICATIONS

Park, J "Comparison of AlGaN/GaN High Electron Mobility Transistor with AlN or GaN as cap layer" E-MRS 2010 Spring Meeting Conference publication on ResearchGate available online at the address provided in the final office action as of Jun. 2015 pp. 1-13) (Year: 2015).*

International Search Report issued in International Patent Application No. PCT/JP2021/019635, dated Aug. 17, 2021; with English translation.

Written Opinion issued in International Patent Application No. PCT/JP2021/019635, dated Aug. 17, 2021; with English translation.

Extended European Search Report dated Sep. 12, 2022 issued in the corresponding European Patent Application No. 21818171.7.

* cited by examiner

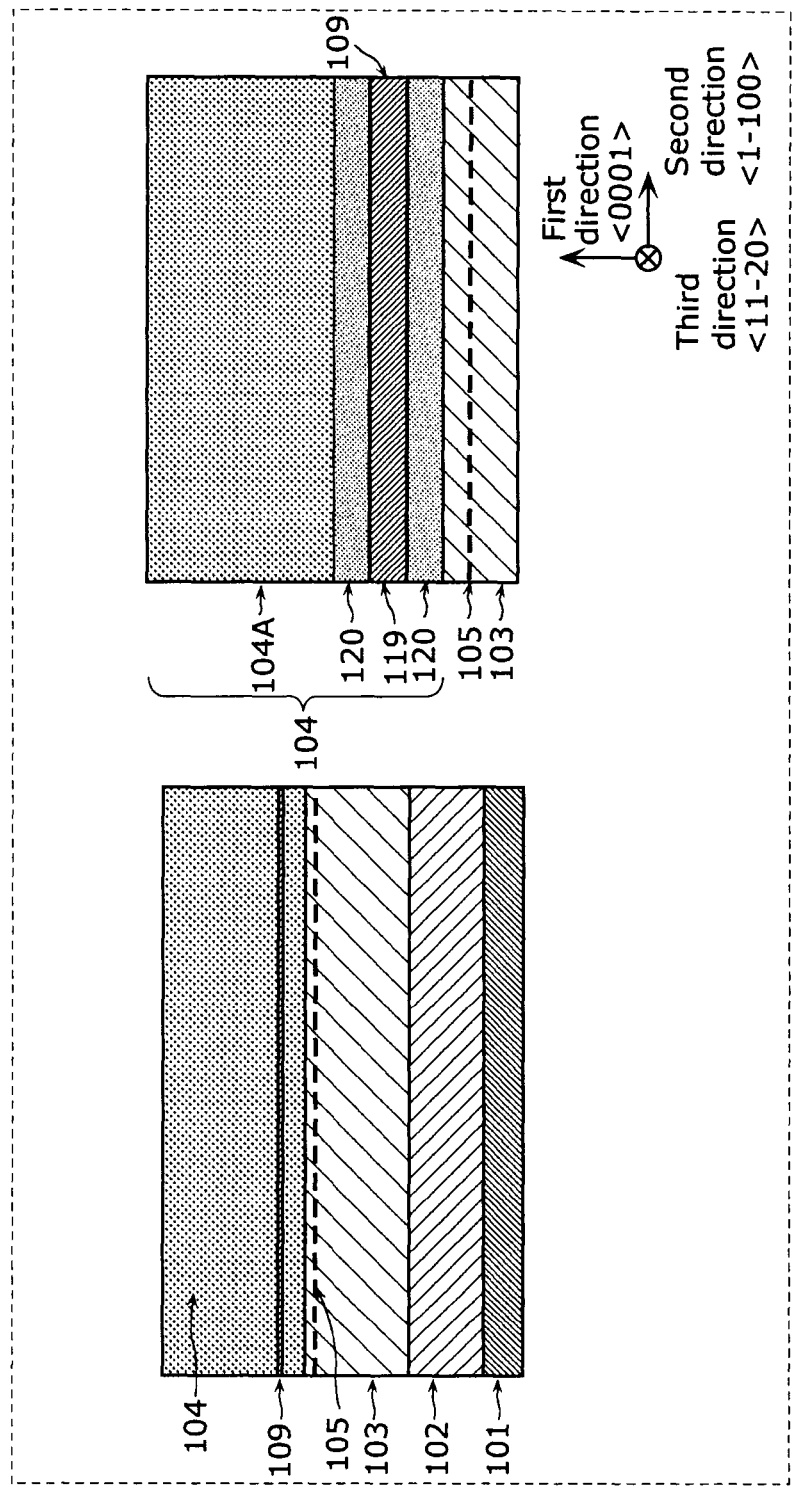

SEMICONDUCTOR DEVICE AND METHOD OF MANUFACTURING SEMICONDUCTOR DEVICE

CROSS-REFERENCE OF RELATED APPLICATIONS

This application is the U.S. National Phase under 35 U.S.C. § 371 of International Patent Application No. PCT/JP2021/019635, filed on May 24, 2021, which in turn claims the benefit of Japanese Patent Application No. 2020-095432, filed on Jun. 1, 2020, the entire disclosures of which applications are incorporated by reference herein.

TECHNICAL FIELD

The present disclosure relates to semiconductor devices, and particularly relates to a group III nitride semiconductor device using a group III nitride semiconductor. This is a patent application concerning the results of research commissioned by the Japanese government, etc. (a patent application subject to Article 17 of the Industrial Technology Enhancement Act in connection with a project for research and development related to basic technologies for the prevalence and deployment of 5G commissioned by the Ministry of Internal Affairs and Communications in the second year of Reiwa (2020)).

BACKGROUND ART

The group III nitride semiconductor devices using the group III nitride semiconductors, especially GaN (gallium nitride) or AlGaN (aluminum gallium nitride), have high dielectric breakdown voltages due to the wide bandgap of the materials. In addition, with the group III nitride semiconductor devices, a hetero structure such as AlGaN/GaN can be easily formed.

With the AlGaN/GaN hetero structure, due to the difference between piezoelectric polarization generated by the difference in lattice constants between the materials and the spontaneous polarization of AlGaN and GaN, a channel consisting of high-concentration electrons (hereinafter referred to as a "two-dimensional electron gas layer") on the GaN layer side of the AlGaN/GaN interface. The group III nitride semiconductor devices using the channels of the above-described two-dimensional electron gas layer have a relatively high electron saturation velocity, relatively high insulation resistance, and relatively high thermal conductivity, and thus are applied to high-frequency power devices.

In order to enhance the characteristics of the above-described group III nitride semiconductor devices, the parasitic resistance components such as the contact (hereinafter referred to as an ohmic contact) between the ohmic electrode and the two-dimensional electron gas layer in the group III nitride semiconductor device and the resistance of the channel may be reduced as much as possible.

FIG. 8 is a cross-sectional view illustrating a configuration in proximity to an ohmic electrode in a group III nitride semiconductor device described in Patent Literature (PTL) 1. As illustrated in FIG. 8, according to PTL 1, buffer layer 1102, GaN layer 1103A, AlN layer 1119, and AlGaN layer 1104A are formed in order above substrate 1101, and two-dimensional electron gas layer 1105 resulting from the hetero structure of AlN layer 1119 and GaN layer 1103A is provided on a GaN layer 1103A side. Ohmic electrode 1108 is formed on recess 1106 where portions of AlGaN layer 1104A, AlN layer 1119, and GaN layer 1103A have been removed. It is described that the angle of recess 1106 intersecting the hetero interface between AlN layer 1119 and GaN layer 1103A to the surface of substrate 1101 on the acute angle side is greater than 0 degrees and less than or equal to 56 degrees. According to the above-described configuration, with the semiconductor device described in PTL 1, two-dimensional electron gas layer 1105 and ohmic electrode 1108 can be in contact with each other and the contact area can be increased, and thus it is possible to reduce the resistance of the ohmic contact.

CITATION LIST

Patent Literature

[PTL 1] Japanese Unexamined Patent Application Publication No. 2007-053185

SUMMARY OF INVENTION

Technical Problem

According to the method described in PTL 1 above, the contact area between two-dimensional electron gas layer 1105 and ohmic electrode 1108 is increased by reducing the angle of recess 1106 intersecting the hetero interface between AlN layer 1119 and GaN layer 1103A to the surface of the substrate 1101 on the acute angle side. However, the contact area is still insufficient. In addition, AlN layer 1119 is capable of improving the electron mobility and sheet carrier concentration of two-dimensional electron gas layer 1105, and thus is indispensable for enhancing the performance of the group III nitride semiconductor device. However, due to the large bandgap, there is a problem that contact from AlGaN layer 1104A that is an upper layer becomes significantly high resistance resulting from AlN layer 1119 being a barrier.

Furthermore, since recess 1106 is formed by dry etching, high resistance layer 1122 including a crystal defect is formed on the surface of AlGaN layer 1104A, AlN layer 1119, and GaN layer 1103A exposed by recess 1106. For that reason, two-dimensional electron gas layer 1105 and ohmic electrode 1108 are not in direct contact with each other, and are distant from each other by the width of high resistance layer 1122. As a result, the resistance of the ohmic contact is increased.

As described above, with the conventional techniques, there is a problem that it is not possible to sufficiently reduce the resistance of the ohmic contact.

The present disclosure has been conceived in view of the above-described problems, and has an object to provide a semiconductor device capable of reducing the resistance of the ohmic contact.

Solution to Problem

A semiconductor device according to one aspect of the present disclosure includes: a substrate; a channel layer disposed above the substrate, the channel layer being a group III nitride not containing Al; a barrier layer disposed above the channel layer, the barrier layer being a group III nitride containing Al; a gate electrode joined to the barrier layer; a recess defined by removing at least a portion of the barrier layer from a surface of a laminated semiconductor including the channel layer and the barrier layer; and an ohmic electrode disposed in the recess, the ohmic electrode being in ohmic contact with a two-dimensional electron gas layer generated in the channel layer. In the semiconductor device, an Al composition ratio distribution of the barrier layer in a first direction perpendicular to a surface of the substrate has a maximum point at a first position, the semiconductor device includes, in the first direction: a first inclined surface of the barrier layer, the first inclined surface including the first position and being in contact with the ohmic electrode; and a second inclined surface of the barrier layer, the second inclined surface intersecting the first inclined surface at a first intersection line on a lower side of the first inclined surface and being in contact with the ohmic electrode, an angle of the second inclined surface to the surface of the substrate is smaller than an angle of the first inclined surface to the surface of the substrate, and a second position that is a position of the first intersection line in the first direction is lower than the first position.

A manufacturing method of a semiconductor device according to one aspect of the present disclosure includes: forming a channel layer above a substrate, the channel layer being a group III nitride not containing Al; forming a barrier layer above the channel layer, the barrier layer being a group III nitride containing Al; performing dry etching to define a recess by removing at least a portion of the barrier layer from a surface of a laminated semiconductor including the channel layer and the barrier layer; performing wet etching using an alkaline chemical solution after the performing of the dry etching, the alkaline chemical solution having a pH value of 10 to 14 and a temperature of greater than or equal to 65 degrees Celsius; forming an ohmic electrode to fill the recess after the performing of the wet etching; and performing a heat treatment on the ohmic electrode.

A manufacturing method of a semiconductor device according to one aspect of the present disclosure includes: forming a channel layer above a substrate, the channel layer being a group III nitride; forming a barrier layer above the channel layer, the barrier layer being the group III nitride and having a band gap larger than a band gap of the channel layer; forming an insulating layer above the barrier layer; forming a mask above the insulating layer, the mask being provided with an opening; forming a side etch by removing, using the mask, (i) an entirety of the insulating layer in a region exposed by the opening and (ii) a portion of the insulating layer to cause a side surface of the insulating layer to be recessed inwardly relative to a side surface of the mask; removing at least a portion of the barrier layer and the channel layer to define a recess, by dry etching using the mask; removing the mask; forming an ohmic electrode to cover the recess and a portion of the insulating layer; and performing a heat treatment on the ohmic electrode.

Advantageous Effects of Invention

A semiconductor device capable of reducing ohmic resistance is provided.

BRIEF DESCRIPTION OF DRAWINGS

FIG. 5A is a cross-sectional view and an enlarged cross-sectional view illustrating a configuration of the semiconductor device during a manufacturing process according to the embodiment.

DESCRIPTION OF EMBODIMENTS

Figure 1:
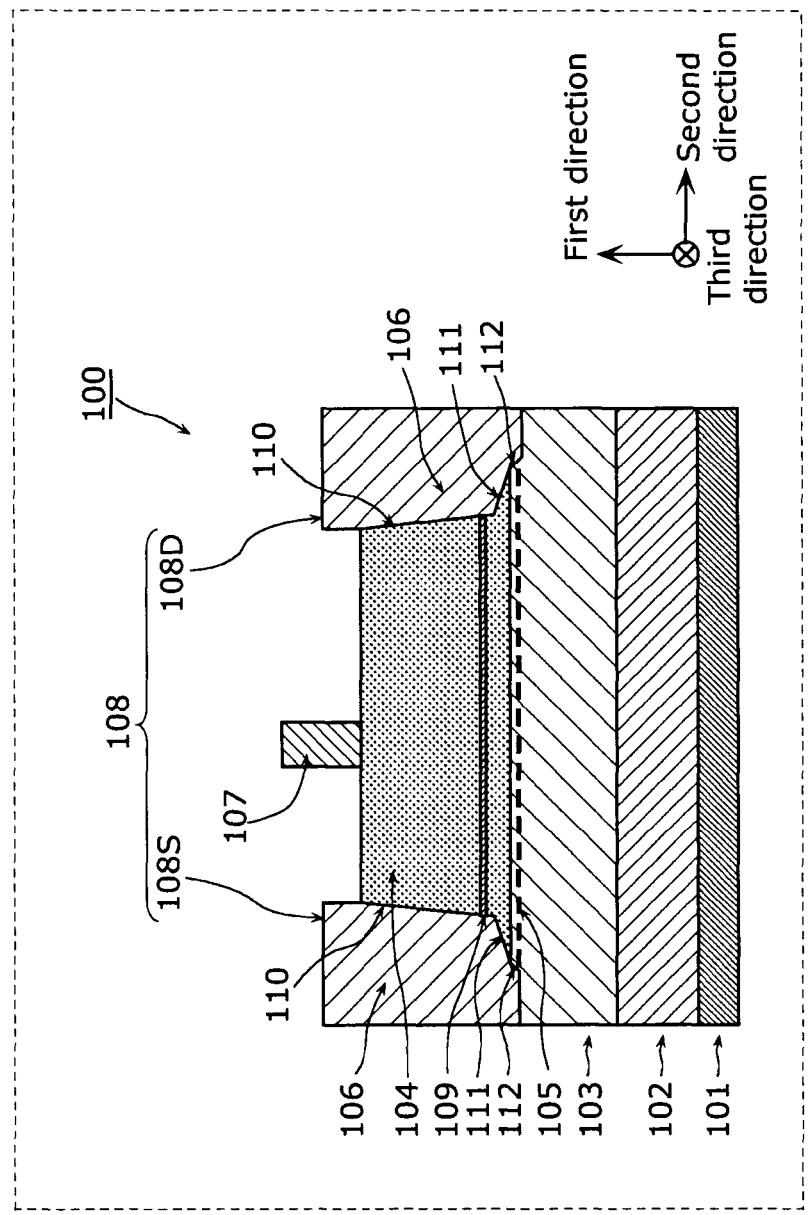
FIG. 1 is a cross-sectional view illustrating a configuration of a semiconductor device according to an embodiment.

The inventors have conducted a series of diligent investigation and experiments in order to provide a semiconductor device capable of reducing the resistance of an ohmic contact. As a result, the inventors have arrived at the following semiconductor device, etc.

A semiconductor device according to one aspect of the present disclosure includes: a substrate; a channel layer disposed above the substrate, the channel layer being a group III nitride not containing Al; a barrier layer disposed above the channel layer, the barrier layer being a group III nitride containing Al; a gate electrode joined to the barrier layer; a recess defined by removing at least a portion of the barrier layer from a surface of a laminated semiconductor including the channel layer and the barrier layer; and an ohmic electrode disposed in the recess, the ohmic electrode being in ohmic contact with a two-dimensional electron gas layer generated in the channel layer. In the semiconductor device, an Al composition ratio distribution of the barrier layer in a first direction perpendicular to a surface of the substrate has a maximum point at a first position, the semiconductor device includes, in the first direction: a first inclined surface of the barrier layer, the first inclined surface including the first position and being in contact with the ohmic electrode; and a second inclined surface of the barrier layer, the second inclined surface intersecting the first inclined surface at a first intersection line on a lower side of the first inclined surface and being in contact with the ohmic electrode, an angle of the second inclined surface to the surface of the substrate is smaller than an angle of the first inclined surface to the surface of the substrate, and a second position that is a position of the first intersection line in the first direction is lower than the first position.

According to the above-described semiconductor device, it is possible to make the barrier layer on the second inclined surface significantly thin. Therefore, the ohmic electrode and the two-dimensional electron gas layer can be in ohmic contact with each other via the second inclined surface, and thus it is possible to increase the contact area. In addition, it is possible to increase the contact area by reducing the angle of the second inclined surface to the surface of the substrate. In addition, since the second inclined surface is formed by wet etching, the high resistance layer formed by dry etching is at least partially removed. As a result, at the second inclined surface where the contacting area is increased, the distance between the two-dimensional electron gas layer and the ohmic electrode is short and there is no resistance component, and thus it is possible to reduce the resistance of an ohmic contact.

In addition, a distance between the first position and the second position may be greater than 0.5 nm and less than or equal to 4 nm.

According to the above-described configuration, the distance between the first position and the second position is made small, and thus the angle of the second inclined surface to the surface of the substrate is made small. As a result, the area of the second inclined surface can further be increased, and thus it is possible to further reduce the resistance of the ohmic contact.

In addition, in a plan view of the substrate, in a plan view of the substrate: the first intersection line may include three or more recess portions each being recessed toward a first inclined surface side in a second direction in which the first inclined surface and the second inclined surface are arranged; and the three or more recess portions may be irregularly arranged in a third direction that is an extending direction of the first intersection line.

According to the above-described configuration, the area of the second inclined surface can further be increased, and thus it is possible to further reduce the resistance of the ohmic contact.

A semiconductor device according to one aspect of the present disclosure includes: a substrate; a channel layer disposed above the substrate, the channel layer being a group III nitride not containing Al; a barrier layer disposed above the channel layer, the barrier layer being a group III nitride containing Al; a gate electrode joined to the barrier layer; a recess defined by removing at least a portion of the barrier layer from a surface of a laminated semiconductor including the channel layer and the barrier layer; and an ohmic electrode disposed in the recess, the ohmic electrode being in ohmic contact with a two-dimensional electron gas layer generated in the channel layer. In the semiconductor device, an Al composition ratio distribution of the barrier layer in a first direction perpendicular to a surface of the substrate has a maximum point at a first position, the semiconductor device includes, in the first direction: a first inclined surface of the barrier layer, the first inclined surface including the first position and being in contact with the ohmic electrode; and a second inclined surface of the barrier layer, the second inclined surface intersecting the first inclined surface at a first intersection line on a lower side of the first inclined surface and being in contact with the ohmic electrode, and in a plan view of the substrate: the first intersection line includes three or more recess portions each being recessed toward a first inclined surface side in a second direction in which the first inclined surface and the second inclined surface are arranged; and the three or more recess portions are irregularly arranged in a third direction that is an extending direction of the first intersection line.

With the above-described semiconductor device, it is possible to increase the area of the second inclined surface, by forming the recess portion. As a result, it is possible to reduce the resistance of the ohmic contact. In addition, since the second inclined surface is formed by wet etching, the high resistance layer formed by dry etching is at least partially removed. As a result, it is possible to reduce the resistance of the ohmic contact, as well as reducing the distance between the two-dimensional electron gas layer and the ohmic electrode.

In addition, in each of the three or more recess portions, an angle of the second inclined surface to the surface of the substrate may be less than 90 degrees.

According to the above-described configuration, the area of the second inclined surface in the recess portion can further be increased, and thus it is possible to further reduce the resistance of the ohmic contact.

In addition, in each of the three or more recess portions, the first intersection line may include a curve.

According to the above-described configuration, since the first intersection line includes a curve in the recess portion, it is possible to alleviate electric field concentration in the end portion of the ohmic electrode in the recess portion.

In addition, each of the three or more recess portions may have a depth greater than or equal to 10 nm and less than or equal to 40 nm in the second direction.

In addition, the barrier layer may include an AlN layer, and the first position may be located within a range defined by a thickness of the AlN layer in the first direction.

In addition, an Al composition ratio of the barrier layer at the first position may be greater than or equal to 90%.

In addition, in the first direction, a distance between the first position and a bottom position of the barrier layer may be less than or equal to 10% of a thickness of the barrier layer.

In addition, a third inclined surface of the channel layer, the third inclined surface intersecting the second inclined surface at a second intersection line on a lower side of the second inclined surface, and being in contact with the ohmic electrode may be included. In the semiconductor device, the angle of the second inclined surface to the surface of the substrate may be smaller than an angle of the third inclined surface to the surface of the substrate.

In addition, a third inclined surface of the channel layer, the third inclined surface intersecting the second inclined surface at a second intersection line on a lower side of the second inclined surface, and being in contact with the ohmic electrode may be included. In the semiconductor device, an angle of the third inclined surface to the surface of the substrate may be smaller than the angle of the first inclined surface to the surface of the substrate.

According to the above-described configuration, since the second inclined surface is formed by wet etching, the angle of the second inclined surface to the surface of the substrate is made small. As a result, the area of the second inclined surface can further be increased, and thus it is possible to further reduce the resistance of the ohmic contact.

In addition, the angle of the first inclined surface to the surface of the substrate may be less than 90 degrees.

According to the above-described configuration, it is possible to implant metal atoms to the second inclined surface when an ohmic electrode is deposited by sputtering. As a result, it is possible to further reduce the resistance of the ohmic contact.

In addition, the second inclined surface may be a semi-polar plane of a semiconductor crystal configuring the barrier layer.

According to the above-described configuration, the second inclined surface is a semi-polar plane of the semiconductor crystal configuring the barrier layer, which facilitates formation of nitrogen holes by heat treatment when forming the ohmic electrode, and making it n-type. As a result, it is possible to further reduce the resistance of the ohmic contact.

In addition, the angle of the second inclined surface to the surface of the substrate may be less than or equal to 5 degrees.

According to the above-described configuration, the area of the second inclined surface can further be increased, and thus it is possible to further reduce the resistance of the ohmic contact.

In addition, in the first direction, a distance between the first position and a bottom position of the recess may be greater than or equal to 1 nm and less than or equal to 10 nm.

According to the above-described configuration, the distance between the first position and the bottom surface of the recess is made relatively small, and thus it is possible to reduce the time period of dry etching when forming the recess. It is thus possible to reduce the amount of formation of the high resistance layer that is formed on the side surface of the recess, thereby enabling an increase in the resistance value to be inhibited. As a result, it is possible to further reduce the resistance of the ohmic contact.

In addition, a <0001> direction of a semiconductor crystal configuring the channel layer may be the first direction.

According to the above-described configuration, the sheet carrier concentration of the two-dimensional electron gas layer can be increased, and thus it is possible to further reduce the resistance of the ohmic contact.

In addition, an extending direction of the gate electrode in a plan view of the substrate may be a <11-20> direction of a semiconductor crystal configuring the channel layer.

According to the above-described configuration, it is possible to enhance the temperature characteristics of Vth.

A manufacturing method of a semiconductor device according to one aspect of the present disclosure includes: forming a channel layer above a substrate, the channel layer being a group III nitride not containing Al; forming a barrier layer above the channel layer, the barrier layer being a group III nitride containing Al; performing dry etching to define a recess by removing at least a portion of the barrier layer from a surface of a laminated semiconductor including the channel layer and the barrier layer; performing wet etching using an alkaline chemical solution after the performing of the dry etching, the alkaline chemical solution having a pH value of 10 to 14 and a temperature of greater than or equal to 65 degrees Celsius; forming an ohmic electrode to fill the recess after the performing of the wet etching; and performing a heat treatment on the ohmic electrode.

According to the above-described manufacturing method of the semiconductor device, the second position that is the position of the first intersection line is lower than the first position that is the maximum point of the Al composition ratio distribution in the first direction, and thus it is possible to make the barrier layer on the second inclined surface significantly thin. Therefore, the ohmic electrode and the two-dimensional electron gas layer can be in ohmic contact with each other via the second inclined surface, and thus it is possible to increase the contact area. In addition, since the second inclined surface is formed by wet etching, the high resistance layer formed by dry etching is at least partially removed. As a result, at the second inclined surface where the contacting area is increased, the distance between the two-dimensional electron gas layer and the ohmic electrode is short and there is no resistance component, and thus it is possible to reduce the resistance of the ohmic contact.

In addition, in a plan view of the substrate, the first intersection line is capable of including a recess portion on the first inclined surface side in the second direction in which the first inclined surface and the second inclined surface are arranged. In the case where three or more recess portions are included, the three or more recess portions are irregularly arranged in the third direction that is an extending direction of the first intersection line. As a result, the area of the second inclined surface can further be increased, and thus it is possible to further reduce the resistance of the ohmic contact.

A manufacturing method of a semiconductor device according to one aspect of the present disclosure includes: forming a channel layer above a substrate, the channel layer being a group III nitride; forming a barrier layer above the channel layer, the barrier layer being the group III nitride and having a band gap larger than a band gap of the channel layer; forming an insulating layer above the barrier layer; forming a mask above the insulating layer, the mask being provided with an opening; forming a side etch by removing, using the mask, (i) an entirety of the insulating layer in a region exposed by the opening and (ii) a portion of the insulating layer to cause a side surface of the insulating layer to be recessed inwardly relative to a side surface of the mask; removing at least a portion of the barrier layer and the channel layer to define a recess, by dry etching using the mask; removing the mask; forming an ohmic electrode to cover the recess and a portion of the insulating layer; and performing a heat treatment on the ohmic electrode.

Hereinafter, a semiconductor device according to an aspect of the present disclosure will be described with reference to the drawings. It should be noted that each of the exemplary embodiments described below shows a specific example of the present disclosure. The numerical values, shapes, elements, the arrangement and connection of the elements, steps (processes), and the processing order of the steps, for instance, described in the following embodiment are mere examples, and thus are not intended to limit the scope of the present disclosure. The drawings are schematic diagrams and do not necessarily give strict illustration. Throughout the drawings, the same numeral is given to substantially the same element, and redundant description is omitted or simplified.

Embodiment

First, a semiconductor device according to an embodiment will be described with reference to FIG. 1, FIG. 2, and FIG. 3.

FIG. 1 is a cross-sectional view illustrating a configuration of semiconductor device 100 according to the embodiment. FIG. 2 is an enlarged cross-sectional view illustrating a configuration of semiconductor device 100 in proximity to an ohmic electrode. FIG. 3 illustrates plan views and cross-sectional views of semiconductor device 100 after dry etch processing, after wet etch processing, and after formation of the ohmic electrode.

In the present embodiment, the case where semiconductor device 100 is a heterojunction field effect transistor (HFET) will be described.

As illustrated in FIG. 1, semiconductor device 100 includes substrate 101, buffer layer 102, channel layer 103, barrier layer 104, two-dimensional electron gas layer 105, recess 106, gate electrode 107, source electrode 108S, and drain electrode 108D. Here, when there is no need to distinguish between source electrode 108S and drain electrode 108D in the description, source electrode 108S and drain electrode 108D are also referred to as ohmic electrode 108.

Substrate 101 is, for example, a substrate including Si. Substrate 101 is not limited to a substrate including Si, but may also be a substrate including sapphire, SiC, GaN, AlN, or the like.

Buffer layer 102 is formed above substrate 101. Buffer layer 102 is, for example, a group III nitride semiconductor layer having a thickness of 2 μm and including a plurality of laminated structures each including AlN and AlGaN. Buffer layer 102 may alternatively include a single layer or multiple layers of group III nitride semiconductors such as GaN, AlGaN, AlN, InGaN, AlInGaN, etc.

Channel layer 103 is formed above substrate 101. According to the present embodiment, channel layer 103 is formed above buffer layer 102 in the +c-plane direction (<0001> direction), for example. Channel layer 103 is a group III nitride semiconductor layer in which Al is not included, and includes GaN having a thickness of 200 nm, for example.

It should be noted that channel layer 103 may include a group III nitride semiconductor of not only GaN but also InGaN or the like, as long as channel layer 103 is a group III nitride semiconductor layer in which Al is not included. In addition, channel layer 103 may contain an n-type impurity.

Barrier layer 104 is formed above channel layer 103. According to the present embodiment, barrier layer 104 is formed above channel layer 103 in the +c-plane direction (<0001> direction), for example. Barrier layer 104 is a group III nitride semiconductor layer in which Al is included. The Al composition ratio distribution of barrier layer 104 in the first direction perpendicular to substrate 101 has a maximum point at first position 109.

According to the present embodiment, two-dimensional electron gas that is highly concentrated is generated on the channel layer 103 side of the hetero interface between barrier layer 104 and channel layer 103 laminated in the +c-plane direction (<0001> direction), and a channel of two-dimensional electron gas layer 105 is formed.

It should be noted that a cap layer that includes GaN and has a thickness of approximately 1 nm to 2 nm, for example, may be provided above barrier layer 104 as a cap layer.

Recess 106 is formed so as to remove the entirety of barrier layer 104 and a portion of channel layer 103 from the surface of the laminated semiconductor including channel layer 103 and barrier layer 104. In addition, recess 106 is formed such that the distance between first position 109 and the bottom position of recess 106 is 6 nm.

It should be noted that recess 106 need only be formed so as to remove at least a portion of barrier layer 104 from the surface of the laminated semiconductor including channel layer 103 and barrier layer 104, and do not necessarily need to be limited to the example in which recess 106 is formed so as to remove the entirety of barrier layer 104 and a portion of channel layer 103.

Gate electrode 107 is formed above barrier layer 104. Gate electrode 107 is in contact with barrier layer 104. More specifically, gate electrode 107 is Schottky bonded to barrier layer 104. Gate electrode 107 has, for example, a multilayer film structure including a Ni film and an Au film laminated in sequence.

It should be noted that gate electrode 107 may be a single layer structure, or a multilayer film structure including Ti, TiN, Ta, TaN, Pt, Pd, Al, W, WN, WSi, Cu, etc. which are laminated in order. In addition, gate electrode 107 and barrier layer 104 need not necessarily be limited to the example in which gate electrode 107 is Schottky bonded to barrier layer 104, and may be in contact with each other by a PN junction, or gate electrode 107 and barrier layer 104 may form a metal-insulator-semiconductor (MIS) structure, a metal-oxide-semiconductor (MOS) structure, etc., for example.

Ohmic electrode 108 is formed above substrate 101. Ohmic electrode 108 is, for example, a multilayer electrode film that has a laminated structure including a Ti film and an Al film laminated in order.

It should be noted that ohmic electrode 108 is not limited to the combination of Ti and Al, but may be a single layer electrode film including a single metal such as Ti, Au, Ta, Al, Mo, Hf, Zr, Au, Cu, etc., or a multilayer electrode film including a combination of two or more of these metals.

Ohmic electrode 108 is disposed in recess 106 and electrically connected to two-dimensional electron gas layer 105. More specifically, barrier layer 104 and channel layer 103 of a side surface of recess 106 react with ohmic electrode 108 as a result of heat treatment to form nitrogen holes and become n-type. In addition, the face of recess 106 at which barrier layer 104 and channel layer 103 are exposed is a semi-polar plane, which makes it easier to form nitrogen holes and to become n-type. In this manner, ohmic electrode 108 is in ohmic contact with two-dimensional electron gas layer 105. Here, the semi-polar plane refers to a plane other than a plane in which atoms are regularly arranged in a GaN crystal.

Next, with reference to FIG. 2, the configuration of semiconductor device 100 in proximity to ohmic electrode 108 will be described in more detail.

Figure 2:
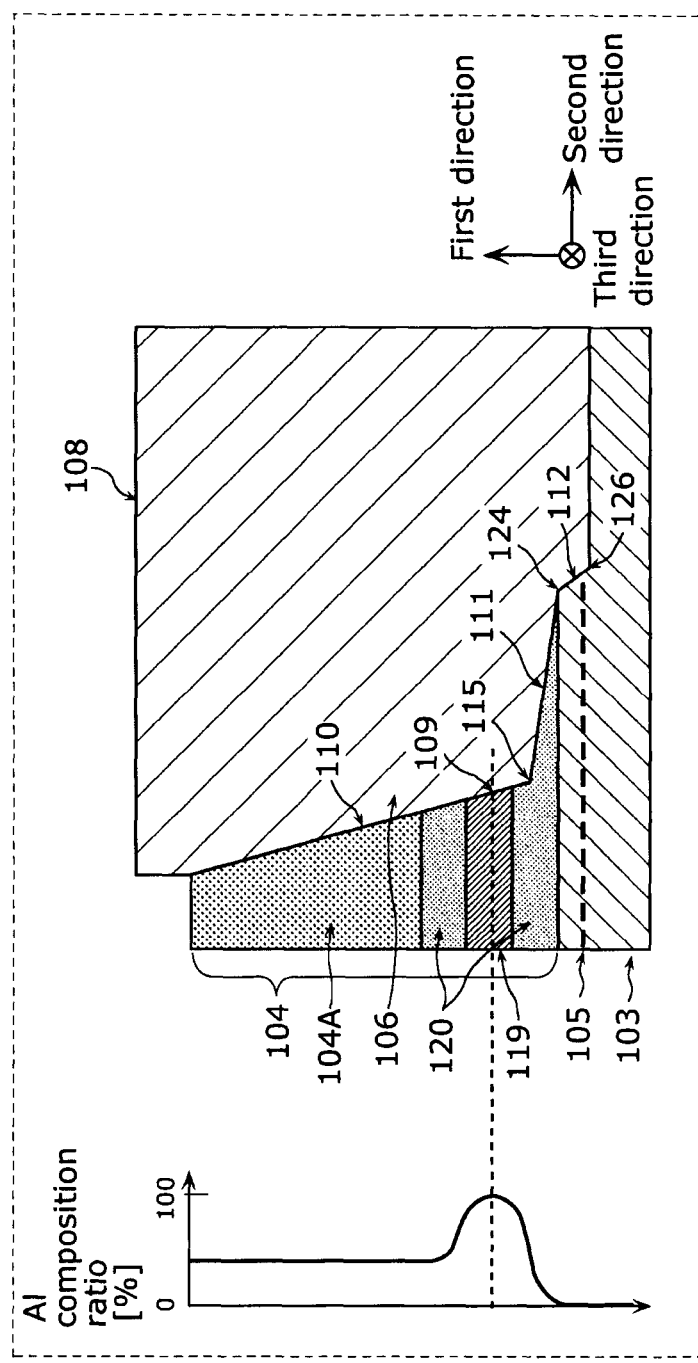
FIG. 2 is an enlarged cross-sectional view illustrating a configuration of the semiconductor device in proximity to an ohmic electrode according to the embodiment.

As illustrated in FIG. 2, barrier layer 104 is a group III nitride semiconductor layer that includes, for example, Al diffusion layer 120 having a thickness of 1 nm, AlN layer 119 having a thickness of 1 nm, Al diffusion layer 120 having a thickness of 1 nm, and AlGaN layer 104A having a thickness of 20 nm and an Al composition ratio of 25%, which are laminated in stated order. Al diffusion layer 120 is formed on the channel layer 103 side and the AlGaN layer 104A side as a result of diffusion of Al from AlN layer 119 due to the heat generated when AlN layer 119 and barrier layer 104 are deposited.

It should be noted that, although the case where there is AlN layer 119 which is a spacer layer in barrier layer 104 has been described in the present embodiment, there may be no AlN layer 119. It should be noted that AlGaN layer 104A may contain In, and barrier layer 104 may contain an n-type impurity.

In addition, recess 106 includes first inclined surface 110 having a maximum point of the Al composition ratio distribution at first position 109 in contact with ohmic electrode 108, second inclined surface 111 below first inclined surface 110, and third inclined surface 112. More specifically, as illustrated in column (b) of FIG. 3, in the first direction, recess 106 includes: first inclined surface 110; second inclined surface 111 intersecting first inclined surface 110 at second position 115 in a cross-sectional view and first intersection line 114 in a plan view; and third inclined surface 112 intersecting second inclined surface 111 at third position 124 in the cross-sectional view and second intersection line 116 in the plan view. Third inclined surface 112 intersects the bottom surface of recess 106 at fourth position 126 which is an edge portion of the bottom surface of recess 106 in the cross-sectional view, and at third intersection line 125 in the plan view. In addition, the angle of second inclined surface 111 to the surface of substrate 101 is smaller than the angle of first inclined surface 110 to the surface of substrate 101, and second position 115 is lower than first position 109.

In the present embodiment, the distance from first position 109 to second position 115 is, for example, 1 nm.

It should be noted that the distance from first position 109 to second position 115 may be greater than 0.5 nm and less than or equal to 4 nm. As described above, it is possible to increase a contact area between ohmic electrode 108 and two-dimensional electron gas layer 105, by reducing the distance from first position 109 to second position 115.

In addition, the angle of second inclined surface 111 to the surface of substrate 101 is smaller than the angle of third inclined surface 112 to the surface of substrate 101. In addition, the angle of third inclined surface 112 to the surface of substrate 101 is smaller than the angle of first inclined surface 110 to the surface of substrate 101. According to the present embodiment, the angles of first inclined surface 110, second inclined surface 111, and third inclined surface 112 to the surface of substrate 101 are arranged such that, for example, the angle of first inclined surface 110 is 70 degrees, the angle of second inclined surface 111 is 2 degrees, and the angle of third inclined surface 112 is 45 degrees.

It should be noted that the angle of second inclined surface 111 to the surface of substrate 101 may be less than or equal to 5 degrees. As described above, it is possible to increase the contact area between ohmic electrode 108 and two-dimensional electron gas layer 105, by reducing the angle of second inclined surface 111 to the surface of substrate 101.

Figure 3:
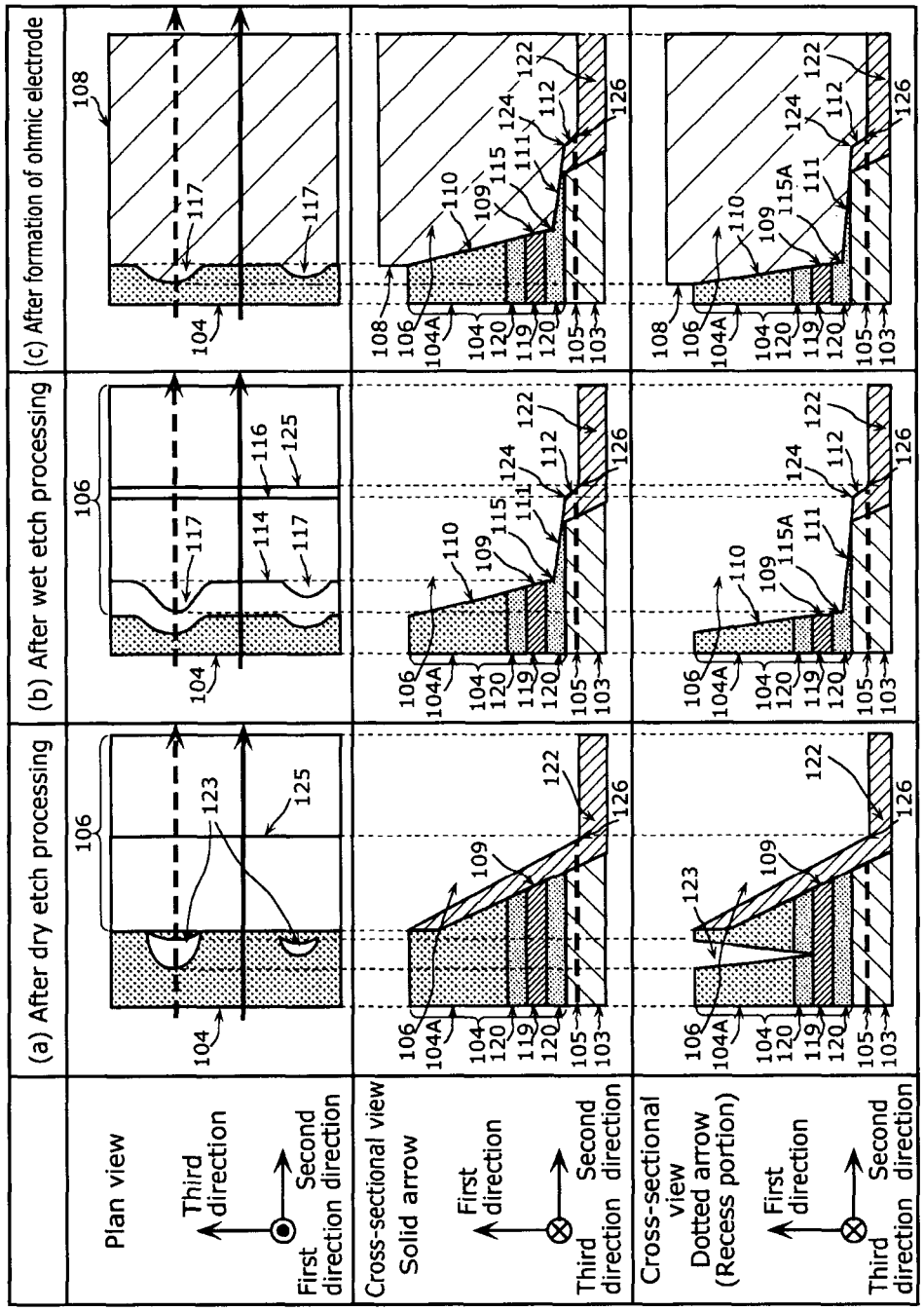
FIG. 3 illustrates plan views and cross-sectional views of the semiconductor device after dry etch processing, after wet etch processing, and after formation of the ohmic electrode, according to the embodiment.

As illustrated in column (b) of FIG. 3, first intersection line 114 includes recess portions 117 on the first inclined surface 110 side in the second direction in which first inclined surface 110 and second inclined surface 111 are arranged. Recess portions 117 are irregularly arranged in the third direction that is an extending direction of first intersection line 114. Second position 115A in recess portions 117 is recessed toward the first inclined surface 110 side compared to second position 115 in other than recess portions 117, thereby increasing the area of second inclined surface 111. As a result, it is possible to further reduce the resistance of the ohmic contact.

It should be noted that, in recess portions 117, the angle of second inclined surface 111 to the surface of substrate 101 may be less than 90 degrees. As described above, it is possible to increase the contact area between ohmic electrode 108 and two-dimensional electron gas layer 105, by setting the angle of second inclined surface 111 to the surface of substrate 101 to less than 90 degrees.

In addition, recess portions 117 may each include a curved portion in a plan view. In this case, it is possible to alleviate the electric field that concentrates at an edge of the ohmic electrode, by including a curved portion in each of recess portions 117. As a result, it is possible to inhibit destruction of the device.

The depth of recess portions 117 in the second direction may be 10 nm to 40 nm. The width of each of recess portions 117 may be 100 nm to 500 nm in the third direction. In addition, recess portions 117 that are arranged may be spaced apart from each other with an interval of 100 nm to 600 nm in the third direction, with a pitch of 200 nm to 1100 nm.

As a result of semiconductor device 100 having the above-described configuration, second position 115 is lower than first position 109, and thus it is possible to make barrier layer 104 on second inclined surface 111 significantly thin, compared to the conventional technique of PTL 1. Therefore, ohmic electrode 108 and two-dimensional electron gas layer 105 can be in ohmic contact with each other via second inclined surface 111, and thus it is possible to increase the contact area.

Figure 4:
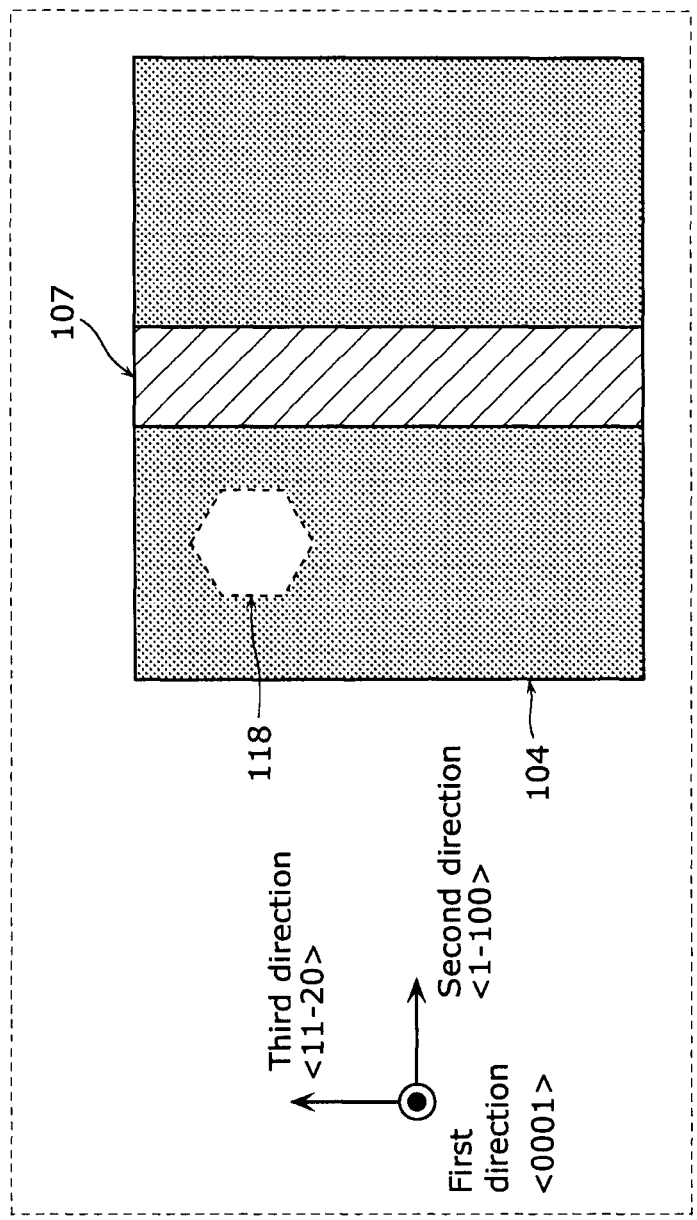
FIG. 4 is an enlarged plan view illustrating a configuration of the semiconductor device in proximity to a gate electrode according to the embodiment.

FIG. 4 is an enlarged plan view illustrating a configuration of semiconductor device 100 in proximity to a gate electrode.

As illustrated in FIG. 4, the extending direction of gate electrode 107 in a plan view of substrate 101 may be in a <11-20> direction of orientation 118 of a semiconductor crystal configuring channel layer 103. Since semiconductor device 100 has such a configuration as described above, it is possible to improve the temperature characteristics of Vth.

The following describes a manufacturing method of semiconductor device 100 according to the present embodiment with reference to FIG. 5A through FIG. 5F, and FIG. 3.

FIG. 5A through FIG. 5F each illustrate a cross-sectional view and an enlarged cross-sectional view indicating a configuration of semiconductor device 100 during a manufacturing process. In FIG. 5A to FIG. 5F, the diagram on the left side is a cross-sectional view illustrating the overall configuration of semiconductor device 100, and the diagram on the right side is an enlarged cross-sectional view illustrating the configuration in proximity to ohmic electrode 108.

First, as illustrated in FIG. 5A, buffer layer 102 having a thickness of 2 μm and including a laminated structure of AlN and AlGaN, channel layer 103 having a thickness of 200 nm and including i-type GaN, AlN layer 119 having a thickness of 1 nm, and i-type AlGaN layer 104A having a thickness of 20 nm and an Al composition ratio of 25% are epitaxially grown in the +c-plane direction (<0001> direction) sequentially above substrate 101 including Si, using a metalorganic chemical vapor deposition (MOCVD). At this time, Al diffusion layer 120 is formed on the channel layer 103 side and the AlGaN layer 104A side as a result of diffusion of Al from AlN layer 119 due to the heat generated when AlN layer 119 and AlGaN layer 104A are deposited. In this manner, barrier layer 104 which includes Al diffusion layer 120, AlN layer 119, and AlGaN layer 104A, and has a maximum point of the Al composition ratio distribution at first position 109. The lower surface of Al diffusion layer 120 on the substrate 101 side becomes the hetero-interface.

Two-dimensional electron gas that is highly concentrated is generated on the channel layer 103 side of the hetero interface between barrier layer 104 and channel layer 103, and a channel of two-dimensional electron gas layer 105 is formed.

Figure 5B:
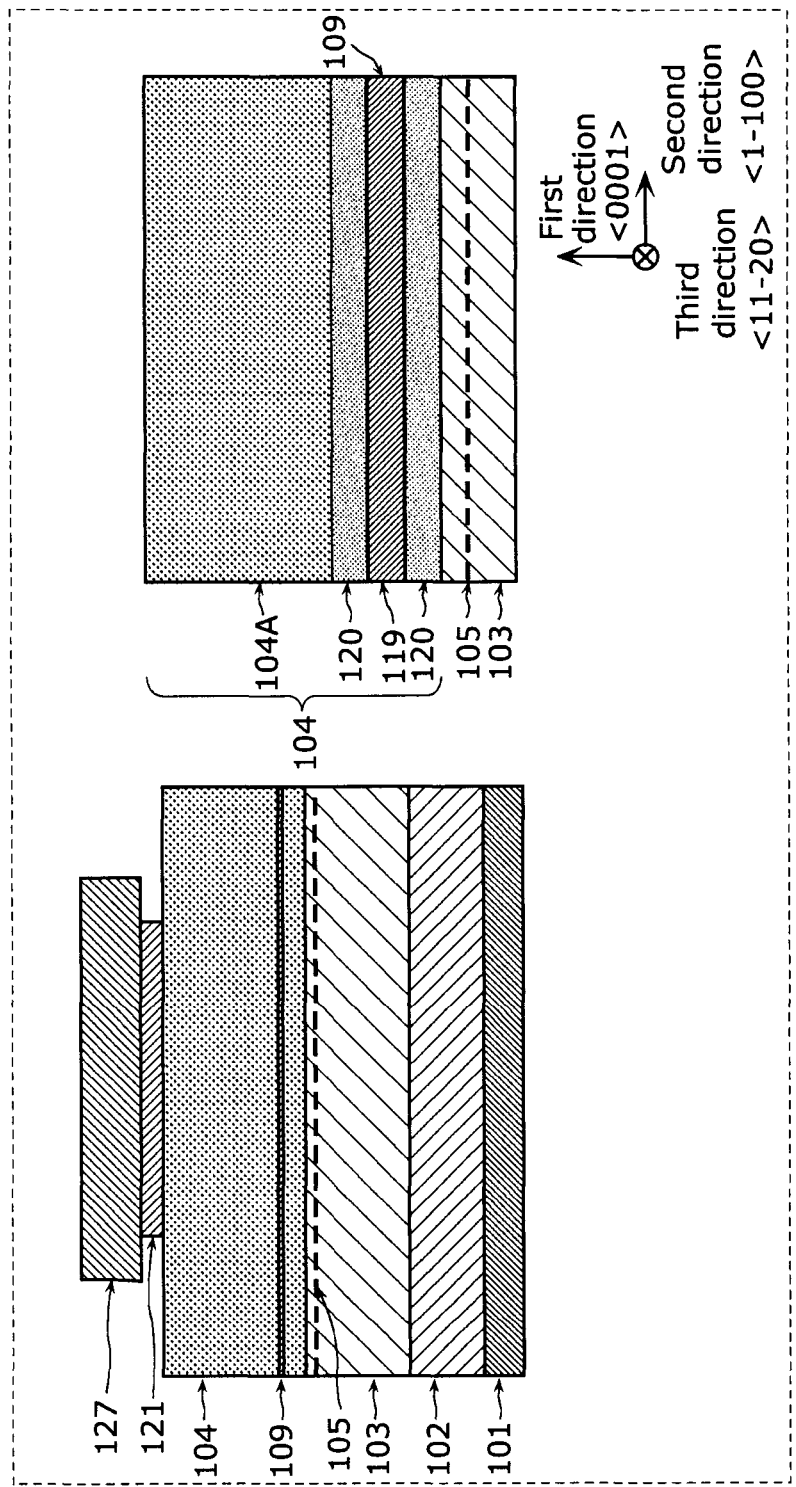
FIG. 5B is a cross-sectional view and an enlarged cross-sectional view illustrating a configuration of the semiconductor device during the manufacturing process according to the embodiment.

Next, as illustrated in FIG. 5B, insulating layer 121 including SiN and having a thickness of 50 nm is deposited on barrier layer 104 using a plasma chemical vapor deposition (CVD) method, and then resist 127 is applied to the region where recess 106 is to be formed, followed by patterning of resist 127 using a lithography method. Next, an opening is formed in insulating layer 121, using a wet etching method, such that barrier layer 104 is exposed. In addition, using the wet etching method, a side etch is provided in insulating layer 121 to form an opening, by causing the side surface of insulating layer 121 to be recessed inwardly relative to the side surface of resist 127 and positioned under resist 127. It should be noted that, although the wet etching method is used according to the present embodiment, a chemical dry etching method may be used to define an opening in insulating layer 121. In addition, insulating layer 121 may be $SiO_2$, SiON, or SiCN.

Figure 5C:
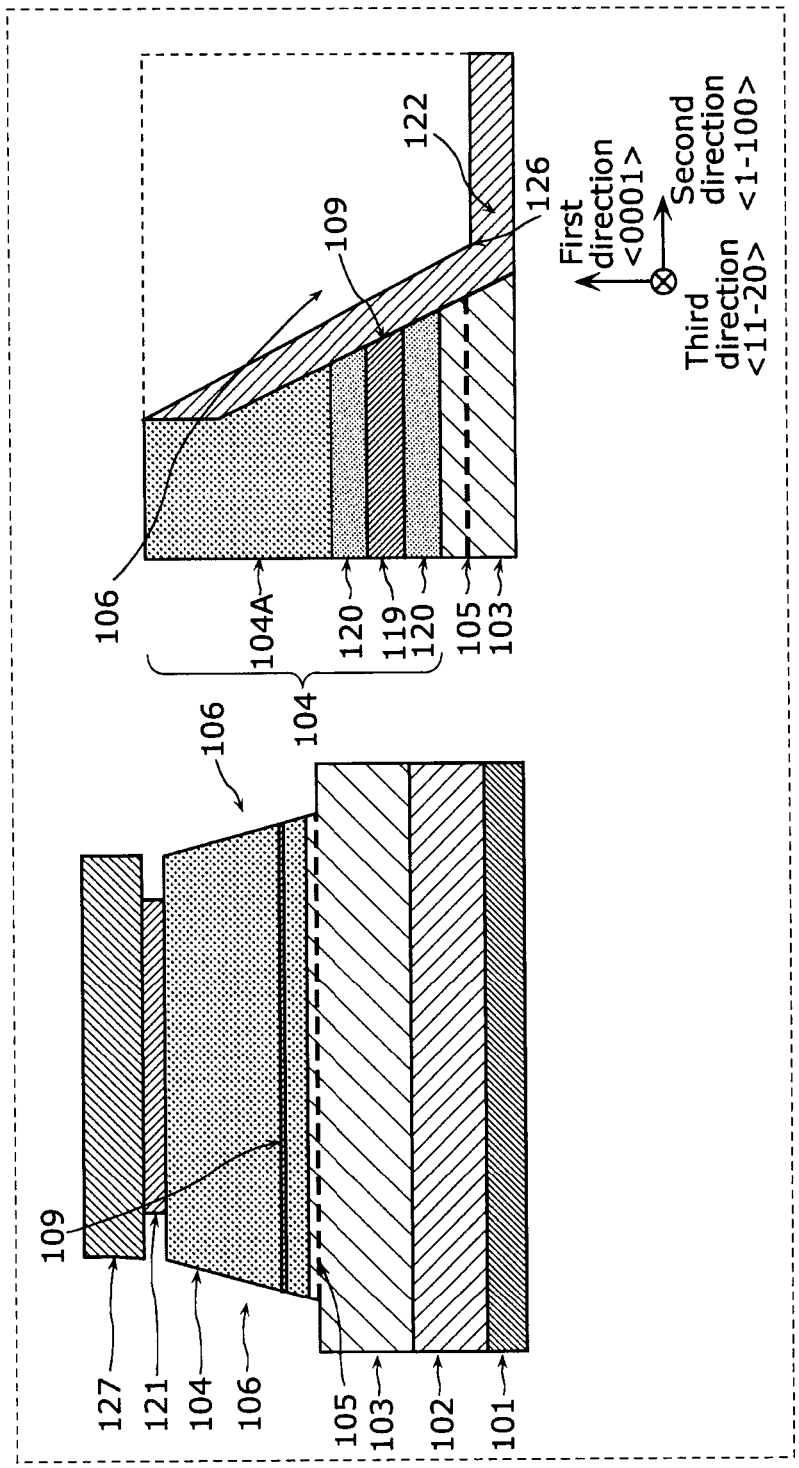
FIG. 5C is a cross-sectional view and an enlarged cross-sectional view illustrating a configuration of the semiconductor device during the manufacturing process according to the embodiment.

Next, as illustrated in FIG. 5C, barrier layer 104 and channel layer 103 are partially removed by performing etching processing with $Cl_2$ gas, using an inductively coupled plasma (ICP) dry etching device with resist 127 as a mask. In this manner, fourth position 126 is formed at the edge portion of the bottom surface of the recess. In a plan view, fourth position 126 corresponds to third intersection line 125 as illustrated in column (a) of FIG. 3. At this time, crystal defects are generated on the surface of barrier layer 104 and channel layer 103 exposed by the dry etch processing, and high resistance layer 122 is formed. In the first direction, the distance between first position 109 and the bottom position of recess 106 is 6 nm according to the present embodiment. In this way, it is possible to inhibit an increase in resistance of high resistance layer 122 by reducing the dry etching time during the formation of recess 106. In addition, in the first direction, the distance between first position 109 and the bottom position of recess 106 may be greater than or equal to 1 nm and less than or equal to 10 nm. The side surface of insulating layer 121 is caused to be recessed inwardly relative to the side surface of resist 127 during the wet etching, and thus is positioned under resist 127. As a result, the side surface of insulating layer 121 is protected by resist 127. For that reason, the top and side surfaces of insulating layer 121 are not subject to loss due to dry etching. Therefore, during the heat treatment to form an ohmic contact, it is possible to reduce the interdiffusion between ohmic electrode 108 and insulating layer 121.

It should be noted that, although recess 106 was formed using resist 127 as a mask in the present embodiment, recess 106 may be formed using insulating layer 121 as a mask after removing resist 127.

As a specific example of the dry etch processing, for example, plasma processing by the ICP dry etching device is described according to the present embodiment. However, plasma processing by a capacitively coupled plasma (CCP) or an electron cyclotron resonance (ECR) dry etching device may be used.

The etching processing using the ICP dry etching device is performed, for example, by introducing $CL_2$ gas at a gas flow rate of 10 sccm to 30 sccm, using $Cl_2$ as a gas feedstock. At this time, in addition to $Cl_2$ gas, $SiH_4$ as a material containing silicon (Si) and/or $SiCl_4$, $BCl_3$, or CCl as a material containing chlorine may be added. In addition, Ar (Argon) or He (Helium) that are inert gas may be introduced to dilute $Cl_2$ gas. The setting conditions for the etching processing are, for example, 0.5 Pa to 3 Pa for the pressure of an etching process atmosphere, 50 W to 200 W for the power applied to an upper electrode by the 13.56 MHz power supply, 5 W to 20 W for the power applied to a lower electrode by the 13.56 MHz power supply, and 0 degrees Celsius to 20 degrees Celsius for the temperature of the substrate.

Figure 5D:
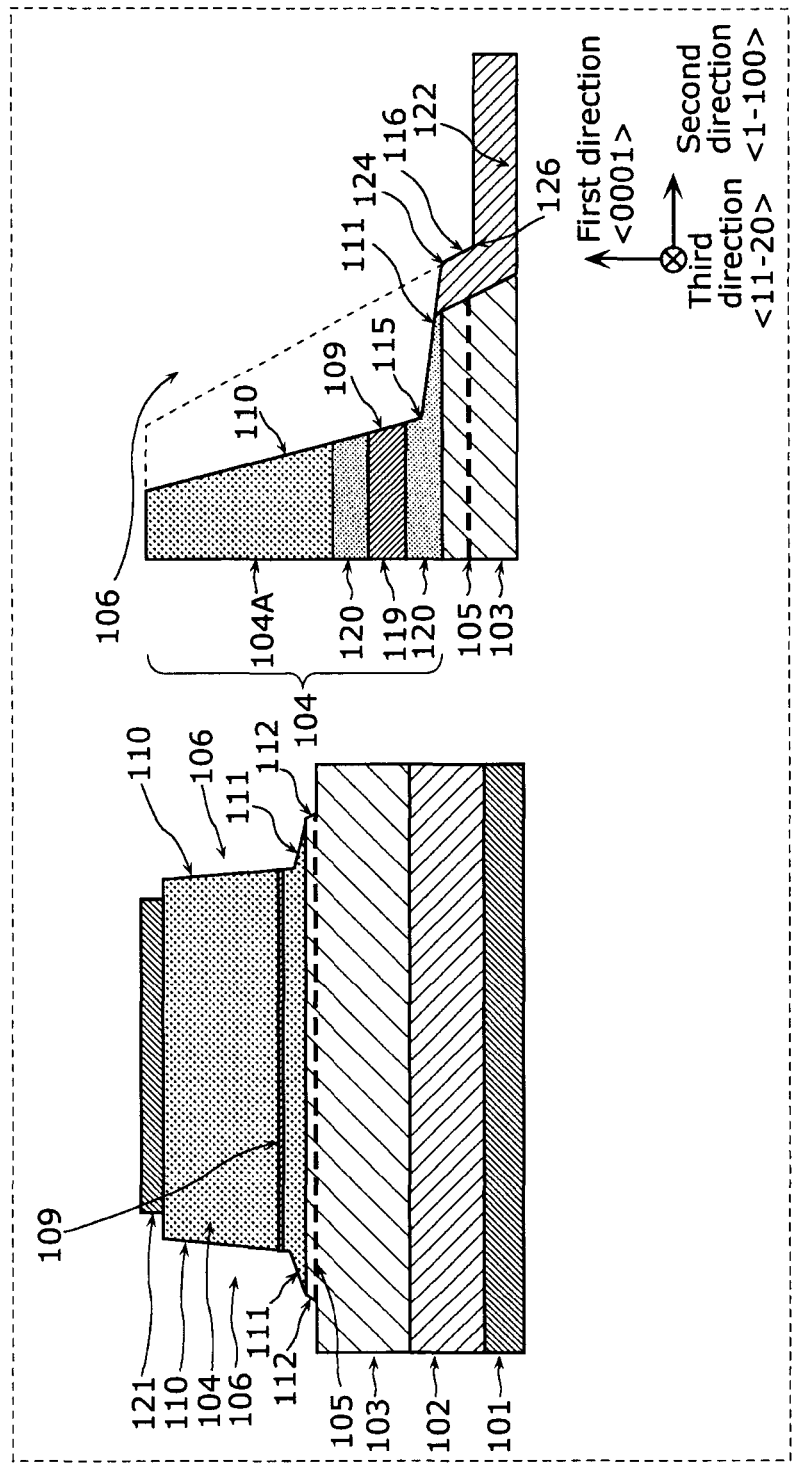
FIG. 5D is a cross-sectional view and an enlarged cross-sectional view illustrating a configuration of the semiconductor device during the manufacturing process according to the embodiment.

Next, as illustrated in FIG. 5D, resist 127 is removed using a resist removal solution, the polymer is removed using a polymer cleaning solution, and then channel layer 103 and barrier layer 104 exposed to the side surface of recess 106 are subjected to wet etching using an alkaline chemical solution with a pH value of 10 to 14 and a temperature of greater than or equal to 65 degrees Celsius, only in a side-surface direction with barrier layer 104 being in high selectivity relative to channel layer 103. In this manner, in cross-sectional view, first inclined surface 110 including first position 109 and second inclined surface 111 are formed in barrier layer 104, and third inclined surface 112 is formed in channel layer 103. As a result, as illustrated in column (b) of FIG. 3, in cross-sectional view, second position 115 at which first inclined surface 110 formed intersects second inclined surface 111 formed and third position 124 at which second inclined surface 111 formed intersects third inclined surface 112 formed are formed. Second position 115 and third position 124 in the cross-sectional view correspond to first intersection line 114 and second intersection line 116, respectively, in the plan view. At this time, second position 115 is located below first position 109. The angles of first inclined surface 110, second inclined surface 111, and third inclined surface 112 with respect to the surface of substrate 101 are formed such that the angle of first inclined surface 110 is 70 degrees, the angle of second inclined surface 111 is 2 degrees, and the angle of third inclined surface 112 is 45 degrees, for example.

In addition, since the wet etch processing removes at least a portion of barrier layer 104 to form first inclined surface 110 and second inclined surface 111, high resistance layer 122 on first inclined surface 110 and second inclined surface 111 is at least partially removed. Since at least a portion of the surface of barrier layer 104 where gate electrode 107 is formed is covered by insulating layer 121, it is possible to inhibit an increase of crystal defects caused by an alkaline chemical solution in barrier layer 104 under gate electrode 107.

In addition, as illustrated in column (a) of FIG. 3, dislocations 123 are present in barrier layer 104. As illustrated in column (b) of FIG. 3, during the wet etch processing, barrier layer 104 is etched with dislocations 123 as starting points, and a plurality of recess portions 117 each including a curve are irregularly formed in barrier layer 104. The angle of first inclined surface 110 to the surface of substrate 101 in recess portions 117 is less than 90 degrees, and the depth of recess portions 117 in the second direction is 10 nm to 40 nm. It should be noted that the width of recess portions 117 may be 100 nm to 500 nm in the third direction. In addition, there may be three or more recess portions 117 that are arranged so as to be spaced apart from each other with an interval of 100 nm to 600 nm in the third direction, with a pitch of 200 nm to 1100 nm.

Here, the reason why first inclined surface 110, second inclined surface 111, and third inclined surface 112 are formed by etching barrier layer 104 only in the side-surface direction with barrier layer 104 being in high selectivity relative to channel layer 103, using an alkaline chemical solution will be described. The etching of AlGaN using an alkaline chemical solution involves crystal orientation dependency and is difficult to etch from the top surface, but can be done from the side surface.

More specifically, in etching of AlGaN using an alkaline chemical solution, since AlGaN has a hexagonal dense structure, the polar plane includes Group III Al or Ga, and thus the etching rate significantly slows down. Meanwhile, the side surface is a semi-polar plane, and thus can be etched at a certain rate.

Next, when the alkaline chemical solution has a pH value of 10 to 14 and a temperature of greater than or equal to 65 degrees Celsius, GaN that contains no Al is not etched, and thus the etching rate gradually increases as the Al content of AlGaN increases.

Accordingly, it is possible to etch only the side surface of barrier layer 104 that contains Al without etching channel layer 103 that contains no Al, and AlN layer 119 that includes first position 109 that is a maximum point in the Al composition ratio distribution in barrier layer 104 is etched the most.

As a result, first inclined surface 110, second inclined surface 111, and third inclined surface 112 are formed with high precision. In addition, since Al diffusion layer 120 on the substrate side is at least partially etched, second position 115 is located below first position 109.

The following describes the relationship between the angles of first inclined surface 110, second inclined surface 111, and third inclined surface 112 to the surface of substrate 101. First, the angle of second inclined surface 111 to the surface of substrate 101 is smaller than the angle of first inclined surface 110 to the surface of substrate 101. The angle of second inclined surface 111 to the surface of the substrate is smaller than the angle of third inclined surface 112 to the surface of substrate 101. The angle of third inclined surface 112 to the surface of substrate 101 is smaller than the angle of first inclined surface 110 to the surface of substrate 101. In addition, the angle of first inclined surface 110 to the surface of substrate 101 is less than 90 degrees. In addition, it is better that the angle of second inclined surface 111 to the surface of the substrate is smaller than or equal to 5 degrees. According to the above-described configuration, it is possible to increase the contact area between ohmic electrode 108 and two-dimensional electron gas layer 105, thereby enabling further reduction in the resistance of the ohmic contact.

It should be noted that, after forming recess 106, barrier layer 104 and channel layer 103 on the surface of recess 106 may be made n-type by plasma processing including $SiCl_4$ gas. In addition, after forming recess 106, a portion of barrier layer 104 and a portion of channel layer 103 may be made n-type by ion implantation device in a predetermined region.

As a specific example of an alkaline chemical solution, for example, etching processing using ammonium-hydrogen peroxide mixture (APM) is explained according to the present embodiment. However, etching processing using tetramethyl ammonium hydroxide (TMAH), kalium hydroxide (KOH), etc. may be performed. The setting of the etching processing using the APM includes, for example, the ratio of $HN_4OH:H_2O_2:H_2O=1:1:5$, and the temperature of the chemical solution is 70 degrees Celsius. Here, the pH value of the alkaline chemical solution may be 10 to 14, and the temperature of the chemical solution may be greater than or equal to 65 degrees Celsius. According to the above-described configuration, it is possible to etch barrier layer 104 only on the side surface with barrier layer 104 being in high selectivity relative to channel layer 103.

Figure 5E:
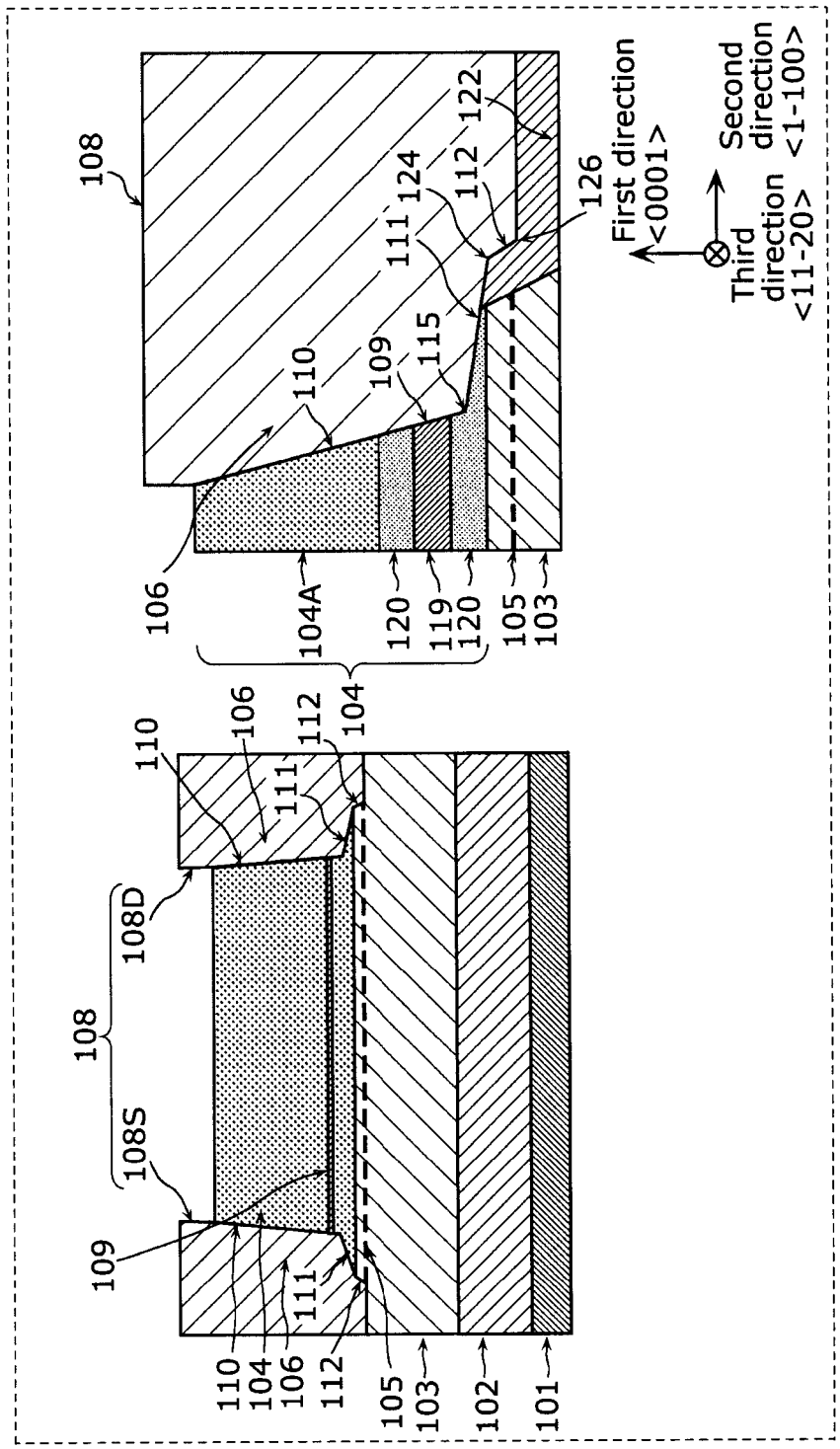
FIG. 5E is a cross-sectional view and an enlarged cross-sectional view illustrating a configuration of the semiconductor device during the manufacturing process according to the embodiment.

Next, as illustrated in FIG. 5E, after pre-cleaning with hydrochloric acid, a Ti film and an Al film are sequentially deposited by the sputtering method, and then the lithography method and the dry etching method are applied in sequence for patterning the laminated film of the Ti film and the Al film, thereby forming ohmic electrode 108 that has a predetermined shape on recess 106.

It should be noted that ohmic electrode 108 that has a predetermined shape may be formed by using a lift-off method to sequentially deposit the Ti film and the Al film with a vapor-deposition technique instead of the sputtering method. In addition, ohmic electrode 108 is not limited to a combination of Ti and Al, but may be a single layer electrode film including a single metal such as Ti, Au, Ta, Al, Mo, Hf, Zr, Au, or Cu, or a multilayer electrode film including a combination of two or more of these metals.

Here, since the angle of first inclined surface 110 to the surface of substrate 101 is less than 90 degrees, it is possible to implant metal atoms to second inclined surface 111 when ohmic electrode 108 is deposited by sputtering. As a result, it is possible to further reduce the resistance of the ohmic contact. In addition, when ohmic electrode 108 is deposited by sputtering, it is possible to deposit it with good coverage. As a result, it is possible to stably reduce the resistance of the ohmic contact.

Next, an ohmic contact between ohmic electrode 108 and two-dimensional electron gas layer 105 is formed by performing a heat treatment at 500 degrees Celsius for one minute under a nitrogen atmosphere. Here, second inclined surface 111 is a semi-polar plane of the semiconductor crystal that constitutes barrier layer 104, which makes it easier to form nitrogen holes and to make it n-type.

It should be noted that, although the temperature of the heat treatment is 500 degrees Celsius according to the present embodiment, the temperature of the heat treatment may be less than or equal to 500 degrees Celsius, or greater than or equal to 500 degrees Celsius and less than 1000 degrees Celsius.

Figure 5F:
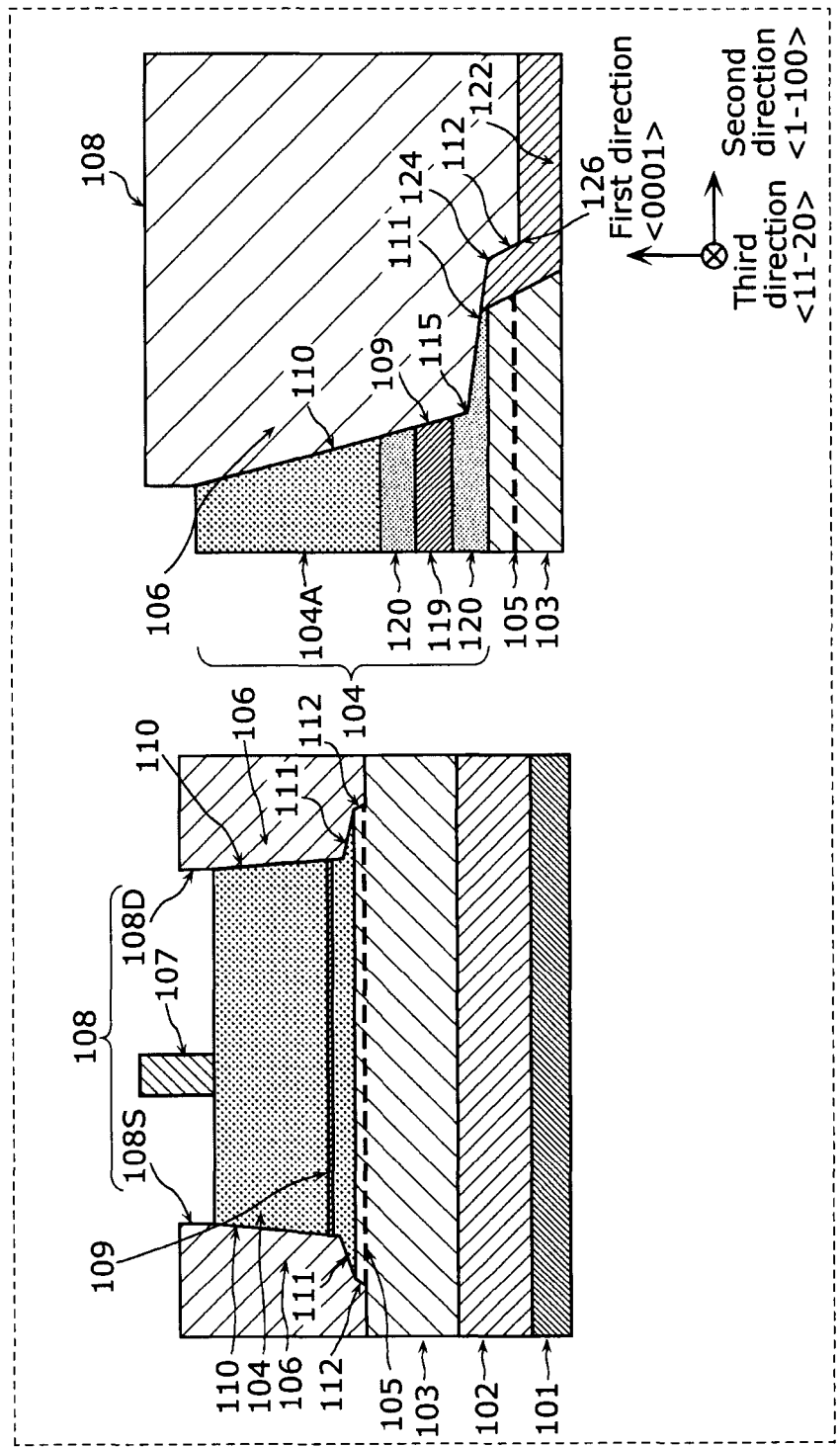
FIG. 5F is a cross-sectional view and an enlarged cross-sectional view illustrating a configuration of the semiconductor device during the manufacturing process according to the embodiment.

Next, as illustrated in FIG. 5F, gate electrode 107 is formed above barrier layer 104 by patterning the laminated films of the Ni film and the Au film by applying the lithography method and the dry etching method in sequence after sequentially depositing the Ni film and the Au film by the sputtering method. It should be noted that gate electrode 107 that has a predetermined shape may be formed by using the lift-off method to sequentially deposit the Ni film and the Au film with a vapor-deposition technique instead of the sputtering method. In addition, the extending direction of gate electrode 107 in a plan view of substrate 101 may be in a <11-20> direction of a semiconductor crystal configuring channel layer 103.

By going through the series of processes as described above, manufacturing of semiconductor device 100 that has the configuration illustrated in FIG. 1 is completed.

In semiconductor device 100 formed as described above, second position 115 is lower than first position 109 at which the Al composition ratio distribution has a maximum point, and thus it is possible to make barrier layer 104 on second inclined surface 111 quite thin. Therefore, ohmic electrode 108 and two-dimensional electron gas layer 105 can be in ohmic contact with each other via second inclined surface 111, and thus it is possible to increase the contact area. In addition, since second inclined surface 111 is formed by wet etching, high resistance layer 122 formed by dry etching is at least partially removed. According to the above-described configuration, in second inclined surface 111 with a large contact area, the distance between two-dimensional electron gas layer 105 and ohmic electrode 108 is short and there is no resistance component, and thus it is possible to further reduce the resistance of the ohmic contact.

Figure 6:
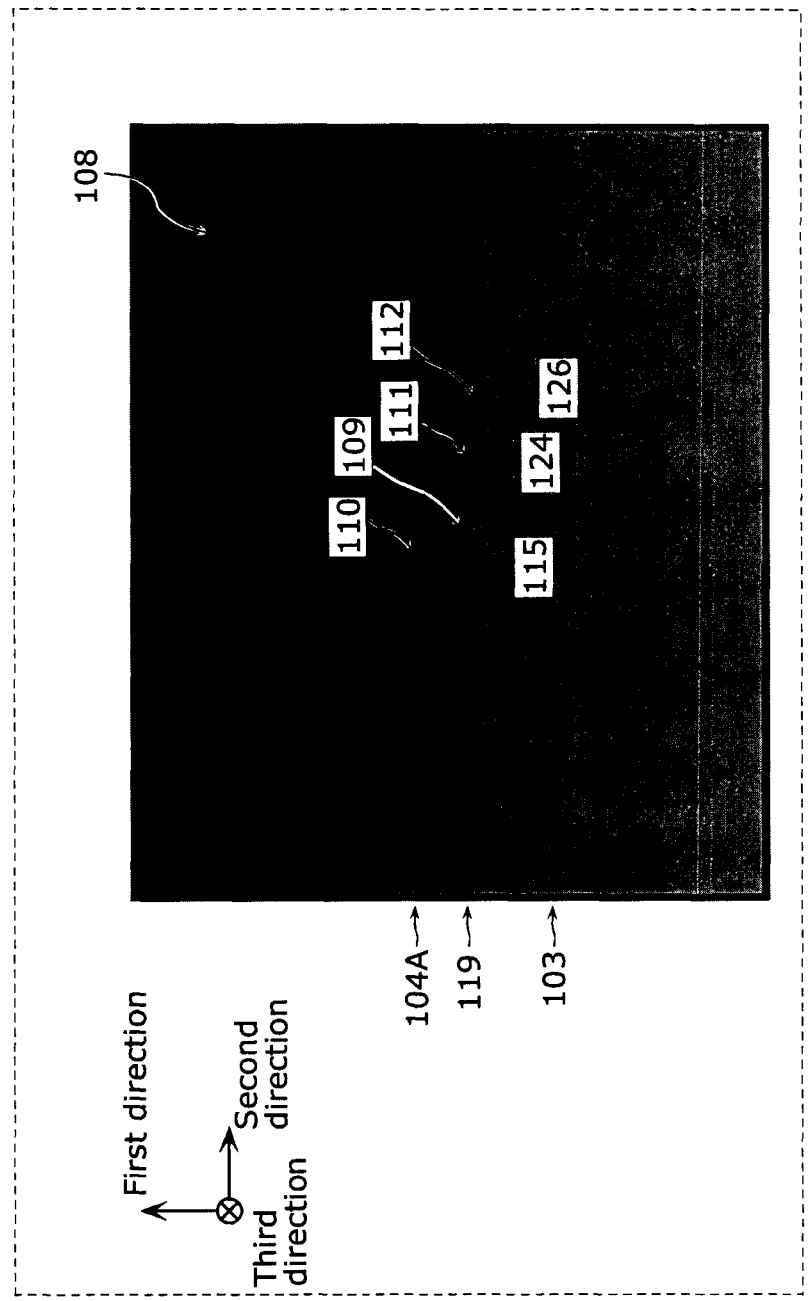
FIG. 6 is a transmission electron microscope (TEM) diagram illustrating a cross-section of the ohmic electrode in the semiconductor device according to the embodiment.

In regard to semiconductor device 100 manufactured using the manufacturing method according to the present embodiment, FIG. 6 illustrates a cross-sectional transmission electron microscope (TEM) photograph showing the cross-section in proximity to the ohmic electrode in the configuration example illustrated in FIG. 2. As illustrated in FIG. 6, second position 115 is lower than first position 109 at which the Al composition ratio distribution has a maximum point, and the angles of first inclined surface 110, second inclined surface 111, and third inclined surface 112 to the surface of substrate 101 are 70 degrees, 2 degrees, and 45 degrees, respectively.

Figure 7:
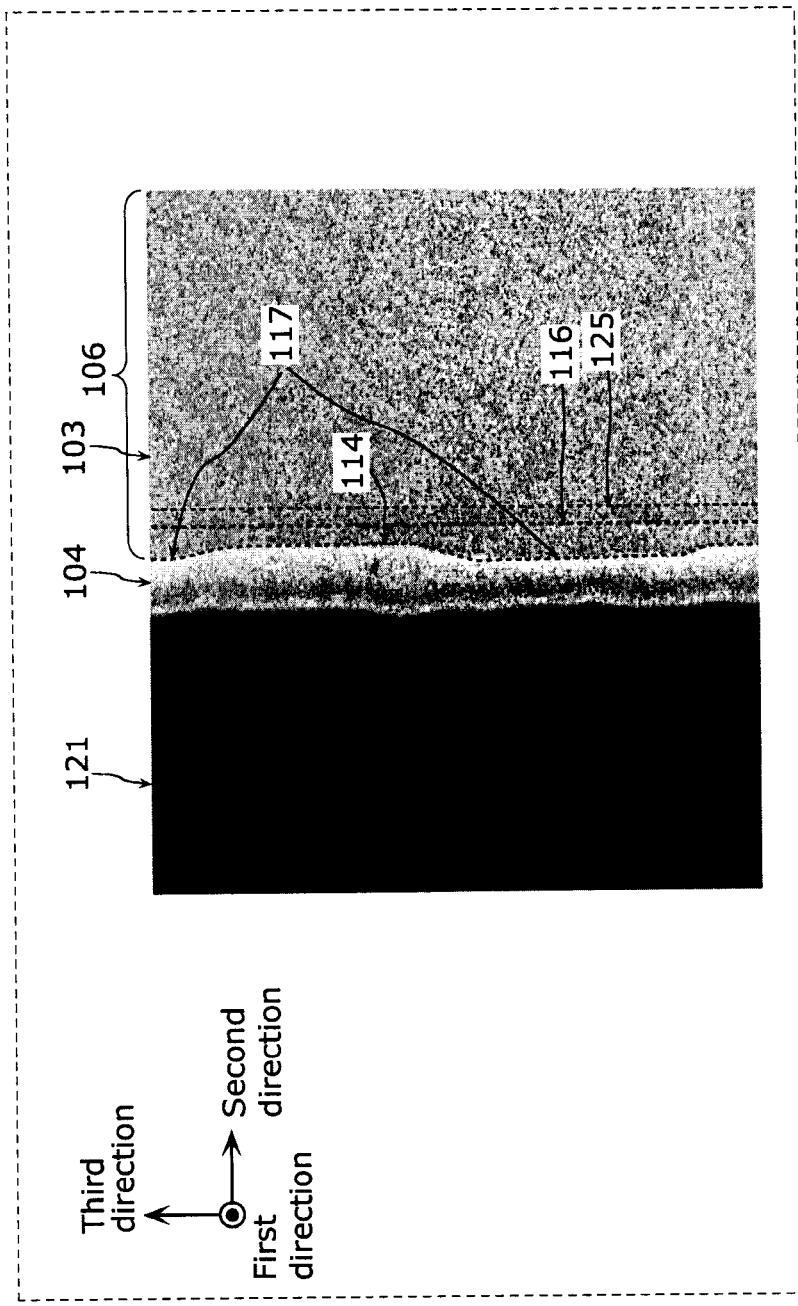
FIG. 7 is a scanning Electron microscope (SEM) diagram illustrating a planar surface of a recess after the wet etch processing in the semiconductor device according to the embodiment
Figure 8:
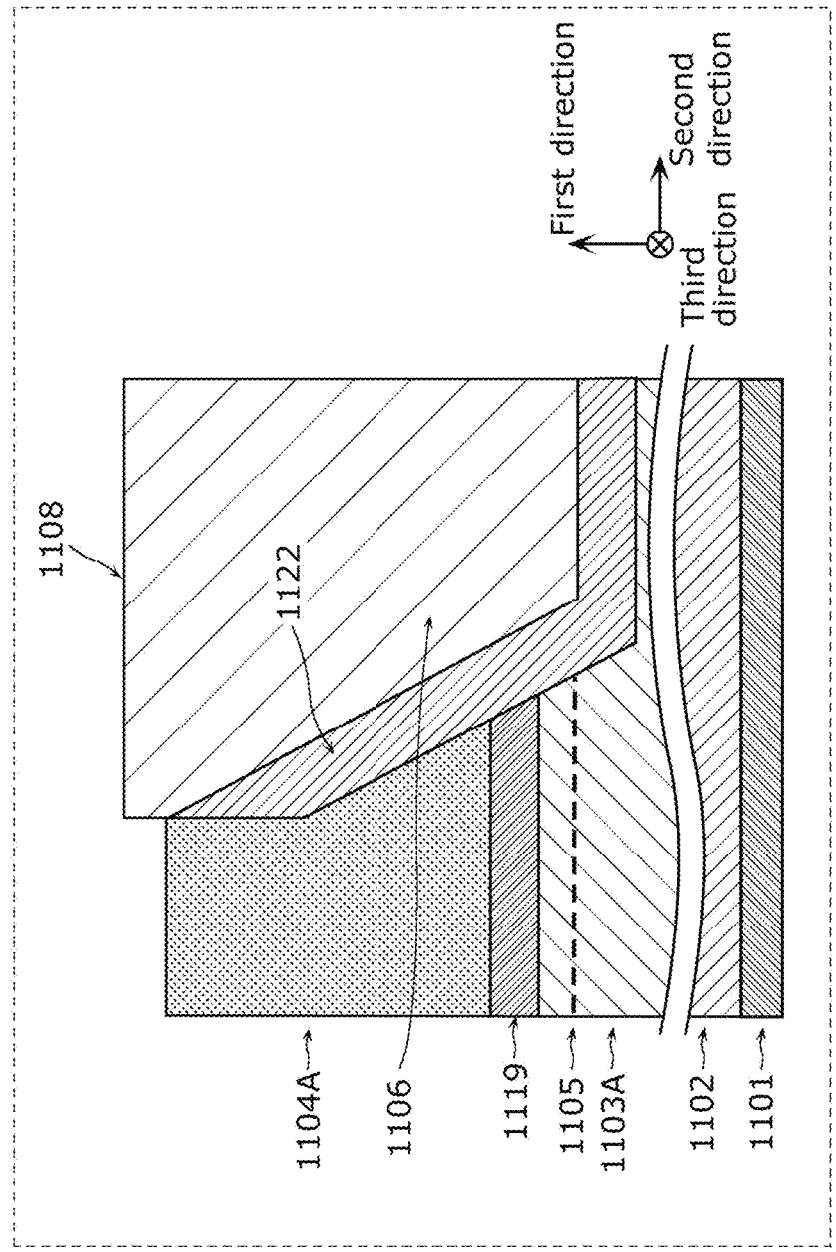
FIG. 8 is an enlarged cross-sectional view illustrating a configuration of a conventional semiconductor device in proximity to an ohmic electrode.

Next, in regard to semiconductor device 100 manufactured using the manufacturing method according to the present embodiment, FIG. 7 illustrates a scanning Electron microscope (SEM) photograph showing the plane of the recess portion after the wet etch processing in the configuration example illustrated in column (b) of FIG. 3. As illustrated in FIG. 7, it can be seen that a plurality of recess portions 117 each including a curve are irregularly provided in barrier layer 104.

[Variation]

Although the semiconductor device according to the present disclosure has been described based on the exemplary embodiment thus far, the present disclosure is not limited to the embodiment described above.

For example, aside from the above, forms obtained by various modifications to the exemplary embodiment that can be conceived by a person of skill in the art as well as forms realized by arbitrarily combining structural components and functions in the exemplary embodiment which are within the scope of the essence of the present disclosure are included in the present disclosure.

INDUSTRIAL APPLICABILITY

The semiconductor device according to the present disclosure is useful for power switching devices, etc. for use in communication devices, inverters, and power supply circuits that require high-speed operation.

The invention claimed is:

1. A semiconductor device comprising:
   a substrate;
   a channel layer disposed above the substrate, the channel layer being a group III nitride not containing Al;
   a barrier layer disposed above the channel layer, the barrier layer being a group III nitride containing Al;
   a gate electrode joined to the barrier layer;
   a recess defined by removing at least a portion of the barrier layer from a surface of a laminated semiconductor including the channel layer and the barrier layer; and
   an ohmic electrode disposed in the recess, the ohmic electrode being in ohmic contact with a two-dimensional electron gas layer generated in the channel layer, wherein
   an Al composition ratio distribution of the barrier layer in a first direction perpendicular to a surface of the substrate has a maximum point at a first position,
   the semiconductor device comprises, in the first direction:
   a first inclined surface of the barrier layer, the first inclined surface including the first position and being in contact with the ohmic electrode; and
   a second inclined surface of the barrier layer, the second inclined surface intersecting the first inclined surface at a first intersection line on a lower side of the first inclined surface and being in contact with the ohmic electrode,
   an angle of the second inclined surface to the surface of the substrate is smaller than an angle of the first inclined surface to the surface of the substrate,
   a second position that is a position of the first intersection line in the first direction is lower than the first position, and
   in a plan view of the substrate:
   the first intersection line includes three or more recess portions each being recessed toward a first inclined surface side in a second direction in which the first inclined surface and the second inclined surface are arranged; and
   the three or more recess portions are irregularly arranged in a third direction that is an extending direction of the first intersection line.

2. The semiconductor device according to claim 1, wherein
   a distance between the first position and the second position is greater than 0.5 nm and less than or equal to 4 nm.

3. The semiconductor device according to claim 1, wherein
   the barrier layer includes an AlN layer, and
   the first position is located within a range defined by a thickness of the AlN layer in the first direction.

4. The semiconductor device according to claim 1, wherein
   an Al composition ratio of the barrier layer at the first position is greater than or equal to 90%.

5. The semiconductor device according to claim 1, further comprising:
   a third inclined surface of the channel layer, the third inclined surface intersecting the second inclined surface at a second intersection line on a lower side of the second inclined surface, and being in contact with the ohmic electrode, wherein
   the angle of the second inclined surface to the surface of the substrate is smaller than an angle of the third inclined surface to the surface of the substrate.

6. The semiconductor device according to claim 1, further comprising:
   a third inclined surface of the channel layer, the third inclined surface intersecting the second inclined surface at a second intersection line on a lower side of the second inclined surface, and being in contact with the ohmic electrode, wherein
   an angle of the third inclined surface to the surface of the substrate is smaller than the angle of the first inclined surface to the surface of the substrate.

7. The semiconductor device according to claim 1, wherein
   the angle of the first inclined surface to the surface of the substrate is less than 90 degrees.

8. The semiconductor device according to claim 1, wherein
   the second inclined surface is a semi-polar plane of a semiconductor crystal configuring the barrier layer.

9. The semiconductor device according to claim 1, wherein
   the angle of the second inclined surface to the surface of the substrate is less than or equal to 5 degrees.

10. The semiconductor device according to claim 1, wherein
    a <0001> direction of a semiconductor crystal configuring the channel layer is the first direction.

11. The semiconductor device according to claim 1, wherein
    an extending direction of the gate electrode in a plan view of the substrate is a <11-20> direction of a semiconductor crystal configuring the channel layer.

12. A semiconductor device comprising:
    a substrate;
    a channel layer disposed above the substrate, the channel layer being a group III nitride not containing Al;

a barrier layer disposed above the channel layer, the barrier layer being a group III nitride containing Al;
a gate electrode joined to the barrier layer;
a recess defined by removing at least a portion of the barrier layer from a surface of a laminated semiconductor including the channel layer and the barrier layer; and
an ohmic electrode disposed in the recess, the ohmic electrode being in ohmic contact with a two-dimensional electron gas layer generated in the channel layer, wherein
an Al composition ratio distribution of the barrier layer in a first direction perpendicular to a surface of the substrate has a maximum point at a first position,
the semiconductor device comprises, in the first direction:
a first inclined surface of the barrier layer, the first inclined surface including the first position and being in contact with the ohmic electrode; and
a second inclined surface of the barrier layer, the second inclined surface intersecting the first inclined surface at a first intersection line on a lower side of the first inclined surface and being in contact with the ohmic electrode,
an angle of the second inclined surface to the surface of the substrate is smaller than an angle of the first inclined surface to the surface of the substrate,
a second position that is a position of the first intersection line in the first direction is lower than the first position, and
in the first direction, a distance from the first position to a hetero interface between the channel layer and the barrier layer is less than or equal to 10% of a distance from an uppermost surface of the barrier layer to a lowest surface of the barrier layer.

13. The semiconductor device according to claim 12, wherein
a distance between the first position and the second position is greater than 0.5 nm and less than or equal to 4 nm.

14. The semiconductor device according to claim 12, wherein
the barrier layer includes an AlN layer, and
the first position is located within a range defined by a thickness of the AlN layer in the first direction.

15. The semiconductor device according to claim 12, wherein
an Al composition ratio of the barrier layer at the first position is greater than or equal to 90%.

16. The semiconductor device according to claim 12, further comprising:
a third inclined surface of the channel layer, the third inclined surface intersecting the second inclined surface at a second intersection line on a lower side of the second inclined surface, and being in contact with the ohmic electrode, wherein
the angle of the second inclined surface to the surface of the substrate is smaller than an angle of the third inclined surface to the surface of the substrate.

17. The semiconductor device according to claim 12, further comprising:
a third inclined surface of the channel layer, the third inclined surface intersecting the second inclined surface at a second intersection line on a lower side of the second inclined surface, and being in contact with the ohmic electrode, wherein an angle of the third inclined surface to the surface of the substrate is smaller than the angle of the first inclined surface to the surface of the substrate.

18. The semiconductor device according to claim 12, wherein
the angle of the first inclined surface to the surface of the substrate is less than 90 degrees.

19. The semiconductor device according to claim 12, wherein
the second inclined surface is a semi-polar plane of a semiconductor crystal configuring the barrier layer.

20. The semiconductor device according to claim 12, wherein
the angle of the second inclined surface to the surface of the substrate is less than or equal to 5 degrees.

21. The semiconductor device according to claim 12, wherein
a <0001> direction of a semiconductor crystal configuring the channel layer is the first direction.

22. The semiconductor device according to claim 12, wherein
an extending direction of the gate electrode in a plan view of the substrate is a <11-20> direction of a semiconductor crystal configuring the channel layer.

23. A semiconductor device comprising:
a substrate;
a channel layer disposed above the substrate, the channel layer being a group III nitride not containing Al;
a barrier layer disposed above the channel layer, the barrier layer being a group III nitride containing Al;
a gate electrode joined to the barrier layer;
a recess defined by removing at least a portion of the barrier layer from a surface of a laminated semiconductor including the channel layer and the barrier layer; and
an ohmic electrode disposed in the recess, the ohmic electrode being in ohmic contact with a two-dimensional electron gas layer generated in the channel layer, wherein
an Al composition ratio distribution of the barrier layer in a first direction perpendicular to a surface of the substrate has a maximum point at a first position,
the semiconductor device comprises, in the first direction:
a first inclined surface of the barrier layer, the first inclined surface including the first position and being in contact with the ohmic electrode; and
a second inclined surface of the barrier layer, the second inclined surface intersecting the first inclined surface at a first intersection line on a lower side of the first inclined surface and being in contact with the ohmic electrode,
an angle of the second inclined surface to the surface of the substrate is smaller than an angle of the first inclined surface to the surface of the substrate,
a second position that is a position of the first intersection line in the first direction is lower than the first position, and
in the first direction, a difference between a vertical height of the first position and a vertical height of a lowest bottom of the recess that is the lowest bottom that is the lowest bottom position below the two-dimensional electron gas layer is greater than or equal to 1 nm and less than or equal to 10 nm.

24. The semiconductor device according to claim 23, wherein a distance between the first position and the second position is greater than 0.5 nm and less than or equal to 4 nm.

25. The semiconductor device according to claim 23, wherein the barrier layer includes an AlN layer, and the first position is located within a range defined by a thickness of the AlN layer in the first direction.

26. The semiconductor device according to claim 23, wherein an Al composition ratio of the barrier layer at the first position is greater than or equal to 90%.

27. The semiconductor device according to claim 23, further comprising:

a third inclined surface of the channel layer, the third inclined surface intersecting the second inclined surface at a second intersection line on a lower side of the second inclined surface, and being in contact with the ohmic electrode, wherein the angle of the second inclined surface to the surface of the substrate is smaller than an angle of the third inclined surface to the surface of the substrate.

28. The semiconductor device according to claim 23, further comprising:

a third inclined surface of the channel layer, the third inclined surface intersecting the second inclined surface at a second intersection line on a lower side of the second inclined surface, and being in contact with the ohmic electrode, wherein an angle of the third inclined surface to the surface of the substrate is smaller than the angle of the first inclined surface to the surface of the substrate.

29. The semiconductor device according to claim 23, wherein the angle of the first inclined surface to the surface of the substrate is less than 90 degrees.

30. The semiconductor device according to claim 23, wherein the second inclined surface is a semi-polar plane of a semiconductor crystal configuring the barrier layer.

31. The semiconductor device according to claim 23, wherein the angle of the second inclined surface to the surface of the substrate is less than or equal to 5 degrees.

32. The semiconductor device according to claim 23, wherein a <0001> direction of a semiconductor crystal configuring the channel layer is the first direction.

33. The semiconductor device according to claim 23, wherein an extending direction of the gate electrode in a plan view of the substrate is a <11-20> direction of a semiconductor crystal configuring the channel layer.

\* \* \* \* \*